United States Patent
Trivedi et al.

(10) Patent No.: US 6,859,068 B1
(45) Date of Patent: Feb. 22, 2005

(54) SELF-CORRECTING I/O INTERFACE DRIVER SCHEME FOR MEMORY INTERFACE

(75) Inventors: Pradeep Trivedi, Sunnyvale, CA (US); Priya Ananthanarayanan, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 17 days.

(21) Appl. No.: 10/637,285

(22) Filed: Aug. 8, 2003

(51) Int. Cl.[7] .............................................. H03K 19/094
(52) U.S. Cl. ............................. 326/86; 326/93; 326/90; 710/100; 710/126
(58) Field of Search .......................... 326/86, 90, 83, 326/82, 93, 30; 710/100, 126

(56) References Cited

U.S. PATENT DOCUMENTS

| | | | |
|---|---|---|---|
| 6,376,869 B1 * | 4/2002 | Tomita ........................ | 257/288 |
| 6,597,202 B1 * | 7/2003 | McCall et al. ................. | 326/93 |
| 6,703,866 B1 * | 3/2004 | Arimilli et al. ............... | 326/86 |
| 6,801,969 B2 * | 10/2004 | Crafts et al. ................. | 710/100 |

* cited by examiner

*Primary Examiner*—Vibol Tan
(74) *Attorney, Agent, or Firm*—Osha & May L.L.P.

(57) ABSTRACT

A self-correcting I/O interface driver scheme uses a delay difference detector to detect a difference in delays between an I/O data path and an I/O clock path. The delay difference detector inputs signals from a data output pin connected to the I/O data path and a clock output pin connected to the I/O clock path. Upon determining a delay difference between the signals from the data and clock output pins, the delay difference detector generates signals to one or more drivers in the I/O data path and the I/O clock path. These signals from the delay difference detector are used to effectively adjust delays of the one or more drivers in order to effectively reduce the delay difference between the I/O data path and the I/O clock path.

20 Claims, 6 Drawing Sheets

SELF-CORRECTING I/O INTERFACE DRIVER SCHEME FOR MEMORY INTERFACE

BACKGROUND OF INVENTION

Figure 1:
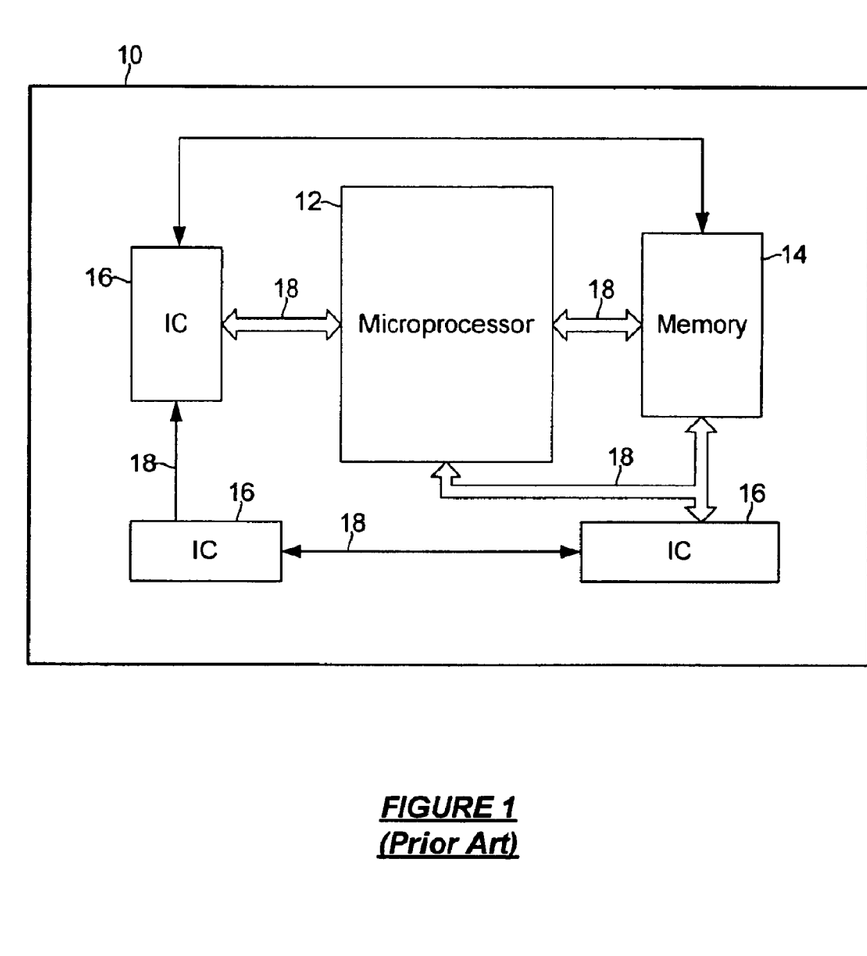
FIG. 1 shows a typical computer system.

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 18, e.g., wires, buses, etc., to accomplish the various tasks of the computer system 10.

Communication between computer system components (e.g., from microprocessor 12 in FIG. 1 to integrated circuit 16 in FIG. 1) occurs across input/output (I/O) interfaces designed to facilitate the flow of data between computer system components. In one type of I/O interface, both a clock signal and data on a data signal are transmitted from a transmitting circuit to a receiving circuit. The receiving circuit uses the clock signal to latch the incoming data.

Figure 2:
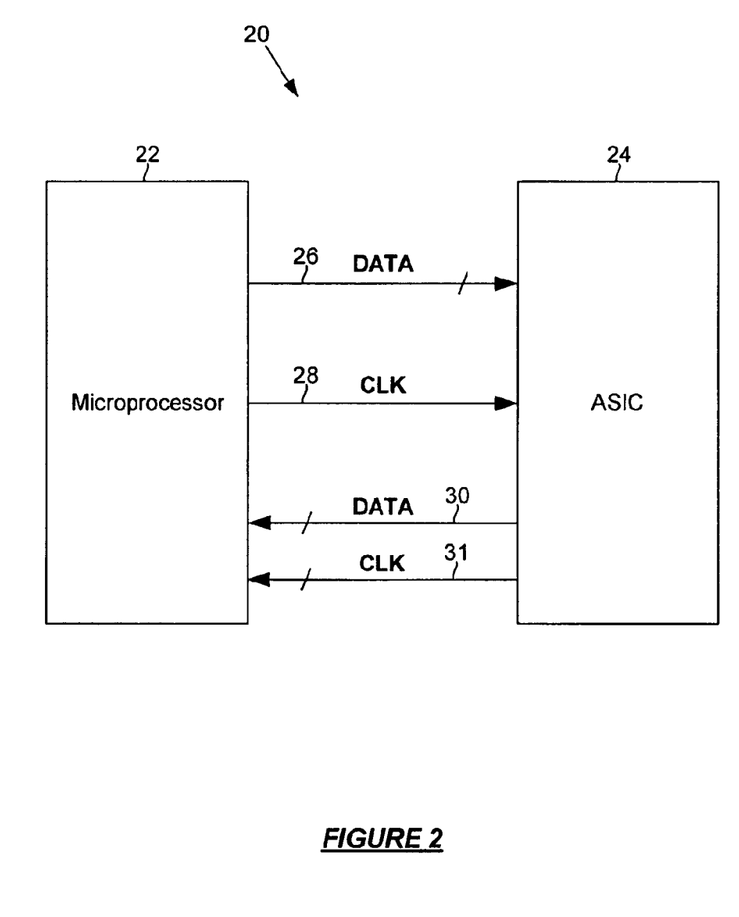
FIG. 2 shows a block diagram of an I/O interface between a microprocessor and an application specific integrated circuit.

Such I/O interfaces in which a clock signal of a transmitting circuit is propagated to a receiving circuit for recovering data sent to the receiving circuit are referred to in the art as "source-synchronous" I/O interfaces. FIG. 2 shows an example of a source-synchronous I/O interface 20. Particularly, FIG. 2 shows an interface between a microprocessor 22 and an application specific integrated circuit (ASIC) 24. The microprocessor 22 transmits a data signal, DATA 26, and a clock signal, CLK 28, to the ASIC 24. The ASIC 24 uses the clock signal 28 to latch the incoming data on the data signal 26. Further, data on a data signal 30 and a clock signal 31 may be transmitted from the ASIC 24 to the microprocessor 22.

Figure 3:
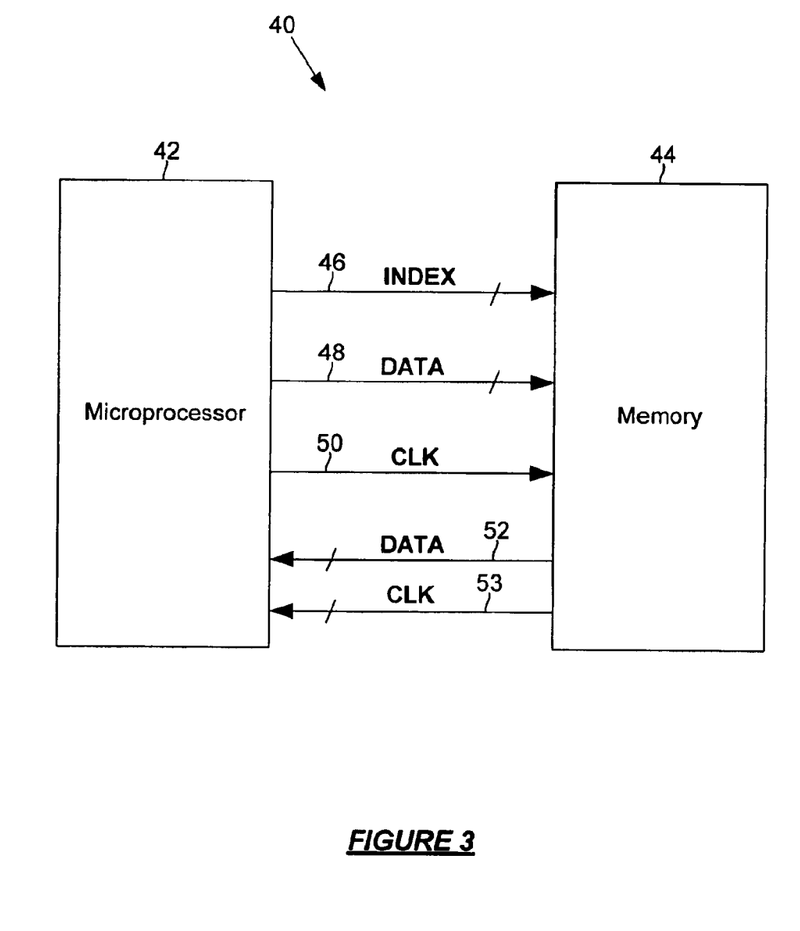
FIG. 3 shows a block diagram of an I/O interface between a microprocessor and a memory circuit.

FIG. 3 shows another example of a source-synchronous I/O interface 40. Particularly, FIG. 3 shows an interface between a microprocessor 42 and a memory circuit 44. The microprocessor 42 transmits a data signal, DATA 48, and a clock signal, CLK 50 to the memory circuit 44. The memory circuit 44 uses the clock signal 50 to latch incoming data on the data signal 48.

In addition to the data signal 48 and the clock signal 50, the microprocessor 42 may transmit an index signal, INDEX 46. The index signal 46 is used to index one or more particular address locations in the memory circuit 44. Further, data on a data signal 52 and a clock signal 53 may be transmitted from the memory circuit 44 to the microprocessor 42.

With respect to a typical I/O interface, such as the ones shown in FIGS. 2 and 3, data is transmitted in a series of binary 0's and 1's from a transmitting circuit (e.g., microprocessor 42 in FIG. 3) to a receiving circuit (e.g., memory circuit 44 in FIG. 3). Accordingly, at any particular time, a data signal received at the receiving circuit may have a low voltage potential representative of a binary "0" or a high voltage potential representative of a binary "1." In order to properly latch such incoming data at a rate equal to the rate at which the data is being sent, a clock signal (e.g., 50 in FIG. 3) sent with the data from the transmitting circuit is used to latch and recover the data at the receiving circuit. Thus, the receiving circuit has a proper reference of time to latch incoming data. Moreover, such an arrangement helps gain timing margins that were lost due to uncertainties of integrated circuit topologies.

In order to drive a clock signal and data on a data signal across an I/O interface, a transmitting circuit uses driver circuitry ("drivers"). As will be further discussed below with reference to FIG. 4, one or more drivers drive data (i.e., data drivers) and one or more drivers drive the clock signal (i.e., clock drivers). For ideal performance, the delays of the path along which the data driver(s) resides and the path along which the clock driver(s) resides should be equal in order to minimize resulting skew between the data and the clock signal at the receiving circuit. However, due to various variations such as power variations, temperature variations, process variations, package trace variations, etc., the delays of the I/O data path (i.e., the path along which the data driver(s) resides) and the I/O clock path (i.e., the path along which the clock driver(s) resides) are often unequal (i.e., mismatched). Such mismatched delays results in the misalignment of the data and the clock signal, which, in turn, may cause inaccurate data capture at the receiving circuit.

In addition to mismatched delays of the driver and clock paths, the speed of communication, or data transmission, across an I/O interface is not commensurate with the increase of integrated circuit and microprocessor speeds. In other words, I/O interface speeds are not increasing at the same rate as processor speeds. Because of this, I/O interface speeds often serve as a bottleneck (i.e., a limiting factor) with respect to overall speed performance in a computer system.

SUMMARY OF INVENTION

According to one aspect of one or more embodiments of the present invention, a computer system comprises a first adjustable driver residing along an I/O data path and arranged to drive data onto a data output pin of an integrated circuit, a second adjustable driver residing along an I/O clock path and arranged to drive a clock signal onto a clock output pin of the integrated circuit, and a delay difference detector arranged to detect a difference in delays of signals operatively connected to inputs of the delay difference detector, where the data output pin and the clock output pin are operatively connected to the inputs of the delay difference detector, and where the delay difference detector has at least one output operatively connected to the first adjustable driver and the second adjustable driver.

According to one aspect of one or more embodiments of the present invention, an I/O interface comprises a microprocessor having an I/O data path operatively connected to a data output pin and an I/O clock path operatively connected to a clock output pin, a delay difference detector arranged to detect a difference in delays of the data output pin and the clock output pin, where at least one of a delay of the I/O data path and a delay of the I/O clock path is adjusted dependent on the detected difference in delay, and a memory circuit arranged to receive data from the data output pin and a clock signal from the clock output pin.

According to one aspect of one or more embodiments of the present invention, a method for correcting an I/O interface comprises propagating a signal through an I/O data path, propagating a signal through an I/O clock path, determining a delay difference between the I/O data path and the I/O clock path, and selectively adjusting at least one of the propagating the signal through the I/O data path and the propagating the signal through the I/O clock path dependent on the delay difference.

According to one aspect of one or more embodiments of the present invention, an integrated circuit comprises first means for driving a signal through an I/O data path to a first output pin of the integrated circuit, second means for driving a signal through an I/O clock path to a second output pin of the integrated circuit, means for detecting a difference in delays of the first output pin and the second output pin, and means for selectively adjusting at least one of a delay of the first means and a delay of the second means dependent on the difference in delays.

Other aspects and advantages of the invention will be apparent from the following description and the appended claims.

DETAILED DESCRIPTION

Figure 4:
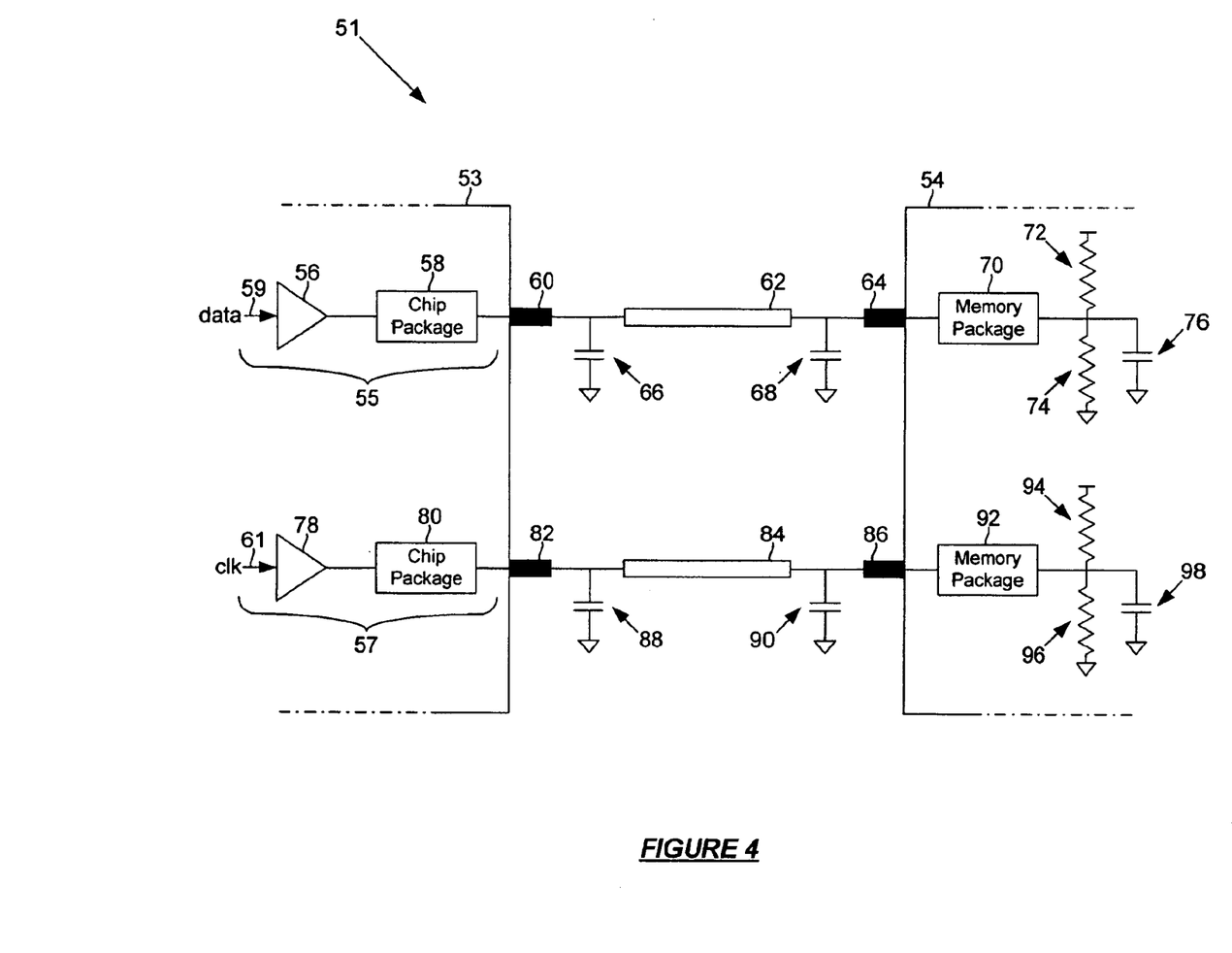
FIG. 4 shows an I/O interface between a microprocessor and a memory circuit.

FIG. 4 shows an implementation of an I/O interface 51. Particularly, FIG. 4 shows an I/O interface of a microprocessor 53 and a memory circuit 54 (e.g., SRAM). Along an I/O data path 55 of the microprocessor 53, data 59 is driven by an I/O data driver 56 to a chip package 58, which, in turn, places the data 59 on data output pin 60. Data output pin 60 is used to "launch" the data 59 onto a printed circuit board (PCB) trace 62.

Data 59 launched onto the PCB trace 62 is received by the memory circuit 54 via a data input pin 64 of the memory circuit 54. In the memory circuit 54, the incoming data is propagated by a memory chip package 70 to termination resistors 72, 74.

Along an I/O clock path 57 of the microprocessor 53, a clock signal 61 is driven by an I/O clock driver 78 to a chip package 80, which, in turn, places the clock signal 61 on clock output pin 82. Clock output pin 82 is used to "launch" the clock signal 61 onto a PCB trace 84.

The clock signal 61 launched onto the PCB trace 84 is received by the memory circuit 54 via a clock input pin 86 of the memory circuit 54. In the memory circuit 54, the incoming clock signal is propagated by a memory chip package 92 to termination resistors 94, 96.

Those skilled in the art will note that the I/O interface 51 is shown in FIG. 4 as including capacitors 66, 68, 76, 88, 90, 98 to represent loads along the signals to which the capacitors 66, 68, 76, 88, 90, 98 are connected.

In addition to the physical separation of the I/O data driver 56 and the I/O clock driver 78, due to process, voltage, and temperature variations between the I/O data driver 56 and the I/O clock driver 78, the delays of the I/O data path 55 and the I/O clock path 57 are susceptible to continuously being mismatched (i.e., unequal). Moreover, those skilled in the art will understand that differences in load as seen by the I/O data driver 56 and the I/O clock driver 78 may also result in delay mismatch. Delay mismatch between the I/O data path 55 and the I/O clock path 57 is typically undesirable because such delay mismatch results in inaccurate data reception by the memory circuit 54 due to the misalignment of the reference of time (i.e., the clock signal 61) used to latch incoming data.

Those skilled in the art will further understand that a delay mismatch between the I/O data path 55 and the I/O clock path 57 may grow as I/O interface operation progresses.

In order to reduce the chances of inaccurate data transmission/reception, and, in turn, improve I/O interface performance, embodiments of the present invention involve a technique that uses a self-correcting I/O interface driver scheme for an I/O interface. The self-correcting I/O interface driver scheme, in accordance with embodiments of the present invention, reduces delay mismatch between an I/O data path and a I/O clock path by substantially equalizing delays of the I/O data and clock paths.

Figure 5:
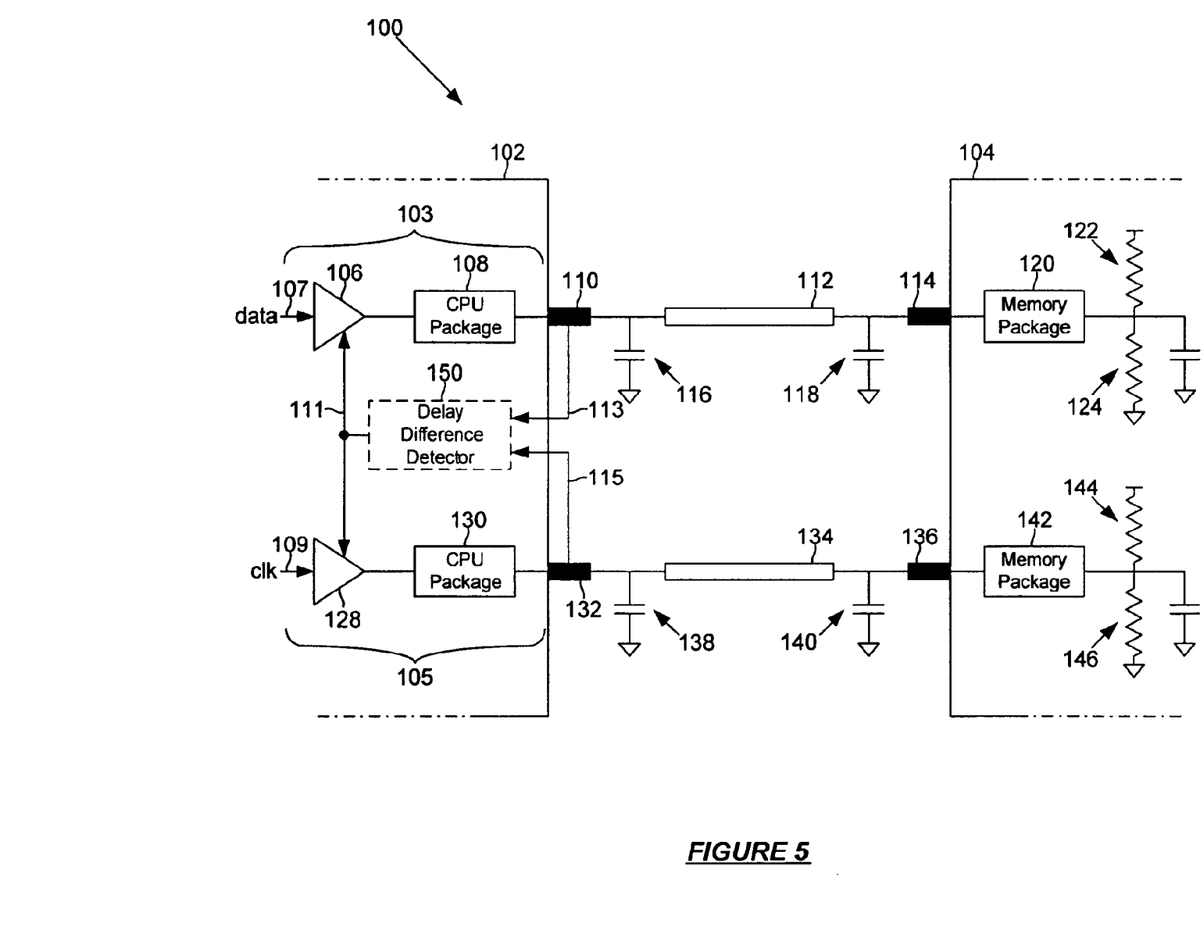
FIG. 5 shows an 110 interface between a microprocessor and a memory interface in accordance with an embodiment of the present invention.

FIG. 5 shows an exemplary I/O interface 100 in accordance with an embodiment of the present invention. Particularly, FIG. 5 shows an interface of a microprocessor 102 and a memory circuit 104 (e.g., SRAM, SDRAM, etc.). Along an I/O data path 103 of the microprocessor 102, data 107 is driven by an I/O data driver 106 to a chip package 108, which, in turn, places the data 107 on data output pin 110. Data output pin 110 is used to "launch" the data 107 onto a PCB trace 112.

Data 107 launched onto the PCB trace 112 is received by the memory circuit 104 via a data input pin 114 of the memory circuit 104. In the memory circuit 104, the incoming data is propagated by a memory chip package 120 to termination resistors 122, 124.

Along an I/O clock path 105 of the microprocessor 102, a clock signal 109 is driven by an I/O clock driver 128 to a chip package 130, which, in turn, places the clock signal 109 on clock output pin 132. Clock output pin 132 is used to "launch" the clock signal 109 onto a PCB trace 134.

The clock signal 109 launched onto the PCB trace 134 is received by the memory circuit 104 via a clock input pin 136 of the memory circuit 104. In the memory circuit 104, the incoming clock signal is propagated by a memory chip package 142 to termination resistors 144, 146.

Those skilled in the art will note that the I/O interface 100 is shown in FIG. 5 as including capacitors 116, 118, 138, 140, 126, 148 to represent loads along the signals to which the capacitors 116, 118, 138, 140, 126, 148 are connected.

Still referring to FIG. 5, a delay difference detector 150 is positioned between data output pin 110 and clock output pin 132. As shown in FIG. 5, a signal 113 connected to the data output pin 110 and a signal 115 connected to the clock output pin 132 serve as inputs to the delay difference detector 150. The delay difference detector 150 is responsive to delay differences between the signals 113, 115 from the data output pin 110 and the clock output pin 132, respectively. The difference in delays of the signal 113 (connected to data output pin 110) and the signal 115 (connected to clock output pin 132) is representative of the difference in delays between the I/O data path 103 and the I/O clock path 105.

Dependent on the amount of delay difference between the signals 113, 115 from the data output pin 110 and the clock output pin 132, respectively, the delay difference detector 150 generates/outputs either analog or digital signals 111 to the I/O data driver 106 and the I/O clock driver 128. The signals 111 from the delay difference detector 150 are used by the I/O data driver 106 and the I/O clock driver 128 to adjust the delays of the I/O data driver 106 and the I/O clock driver 128.

In such a manner, the I/O interface 100 is self-correcting in that the delay difference detector 150 dynamically and continuously generates signals 111 that are representative of differences in delays between the I/O data path 103 and the I/O clock path 105, where the signals 111 are then used by respective drivers in the I/O data path 103 and the I/O clock path 105 to effectively reduce the difference in delay between the I/O data path 103 and the I/O clock path 105.

In order to set the delay difference detector output signals 111 during, for example, a calibration stage, a clock-like pattern is propagated through the I/O data path 103 and the I/O clock path 105. In one or more embodiments of the present invention, the clock-like pattern propagated through the I/O data path 103 and the I/O clock path 105 may be sent during an initialization process used when periodically setting the delay difference detector output signals 111. Those skilled in the art will also understand that the clock-like pattern propagated through the I/O data path 103 may have substantially the same frequency as the clock signal 109 propagated through the I/O clock path 105. Further, the self-correcting I/O interface driver scheme may be activated during normal operation. A more detailed description of how the comparison signals 111 may be set is given below with reference to FIG. 6.

Still referring to FIG. 5, although the delay difference detector 150 is shown as being disposed on the microprocessor 102, those skilled in the art will understand that, in one or more embodiments of the present invention, the delay difference detector 150 may be positioned external to the microprocessor 102.

In one or more other embodiments of the present invention, the I/O data driver (e.g., 106 in FIG. 5) and/or the I/O clock driver (e.g., 128 in FIG. 5) may be, but not limited to, a delay locked loop, a RC delay adjustment circuit, etc. Those skilled in the art will appreciate that other types of adjustable drivers and buffers may be used without departing from the scope of the present invention.

Moreover, those skilled in the art will understand that the implementation of the I/O data driver (e.g., 106 in FIG. 5), the I/O clock driver (e.g., 128 in FIG. 5), and the delay difference detector (e.g., 150 in FIG. 5) as described in the present invention results in a self-correcting closed loop system. Thus, minimal error is introduced into the system.

Figure 6:
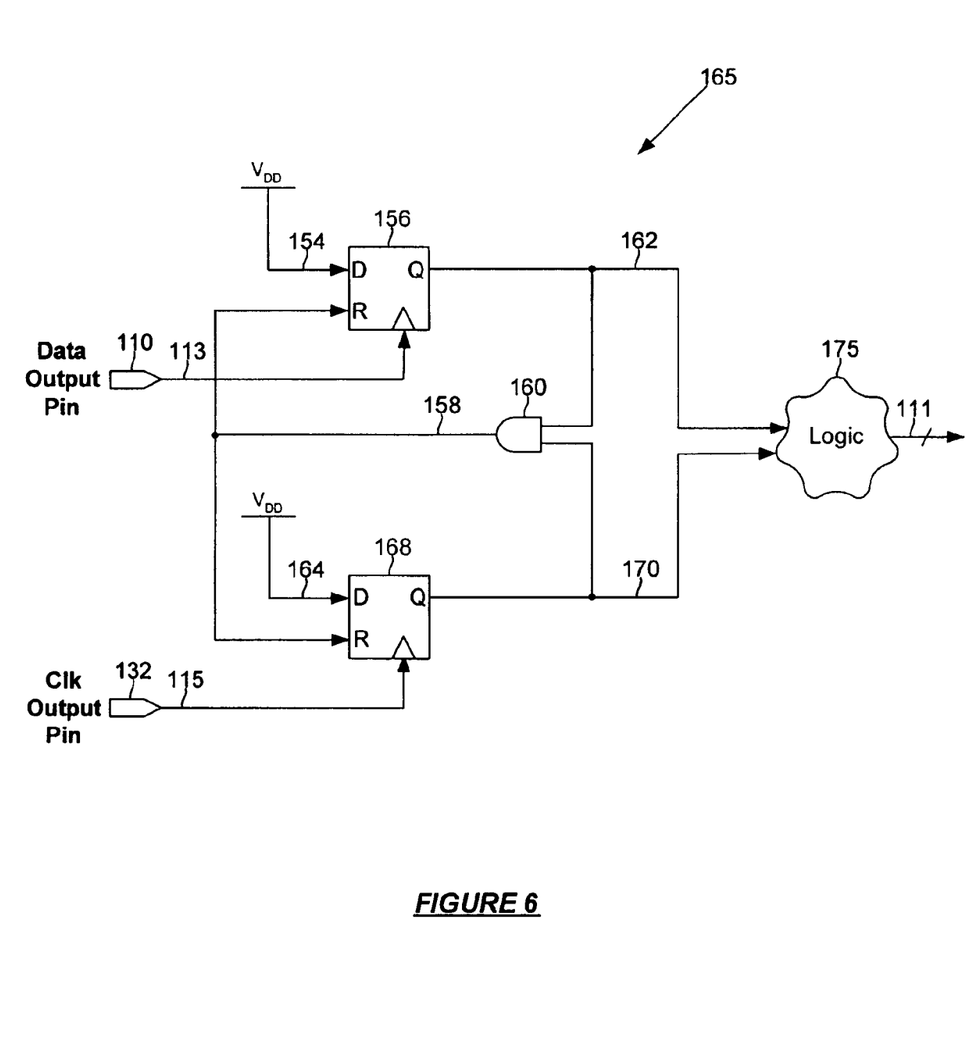
FIG. 6 shows a delay difference detector in accordance with an embodiment of the present invention.

FIG. 6 shows an implementation of a known delay difference detector 165 (referred to in the art as a "phase detector" or "phase-frequency detector") that may be used in accordance with an embodiment of the present invention. As discussed above, a clock-like pattern is propagated through the I/O data path (e.g., 103 in FIG. 5) and the I/O clock path (e.g., 105 in FIG. 5) when setting the delay difference detector output signals (e.g., 111 in FIG. 5). As shown in FIG. 6, signal 113 connected to data output pin 110 serves as a clock input to a flip-flop 156. Signal 115 connected to clock output pin 132 serves as a clock input to a flip-flop 168.

When signal 113 transitions from a low state to a high state, flip-flop 156 transfers the high state created by the power supply $V_{DD}$ 154 on an input of the flip-flop 156 to a signal 162. When signal 115 transitions from a low state to a high state, flip-flop 168 transfers the high state created by the power supply $V_{DD}$ 164 on an input of the flip-flop 168 to a signal 170. When both the signals 162, 170 are at a high state, an AND gate 160 outputs a high state on signal 158. The high state on signal 158 resets both flip-flops 156, 168. The signals 162, 170 transition to a low state when the flip-flops 156, 168 are reset, respectively.

Accordingly, if signal 113 (representative of the clock-like pattern propagated through the I/O data path (e.g., 103 in FIG. 5)) and signal 115 (representative of the clock signal (e.g., 109 in FIG. 5) propagated through the I/O clock path (e.g., 105 in FIG. 5)) have a difference in delay, the delays of the I/O data path (e.g., 103 in FIG. 5) and the I/O clock path (e.g., 105 in FIG. 5) are mismatched.

In the case that the delays are mismatched, the delay difference detector 165 reduces the delay difference by setting the delay compensation signals/bits 111 to selectively adjust/vary one or more of the I/O data driver (e.g., 106 in FIG. 5) and the I/O clock driver (e.g., 128 in FIG. 5) through logic 175. Still referring to FIG. 6, for example, if a delay difference is indicated by signal 113 leading signal 115 (i.e., signal 115 lagging signal 113), then the signal 162 remains at a high state for a longer period of time than does signal 170. Alternatively, if the delay difference is indicated by signal 113 lagging signal 115 (i.e., signal 115 leading signal 113), then the signal 170 remains at a high state for a longer period of time than does signal 162. Note that once the lagging signal arrives at its respective flip-flop 156 or 168, the signals 162, 170 are reset to the low state after some propagation delay due to the delays of the AND gate 160 and the flip-flops 156, 168.

In this manner, the delay difference detector 165 is able to respond to and indicate the delay differences between the I/O data path (e.g., 103 in FIG. 5) and the I/O clock path (e.g., 105 in FIG. 5). Dependent on the signals 162, 170 in the delay difference detector 165, the logic 175 generates the delay difference detector output signals 111 that are used to adjust/vary the I/O data driver (e.g., 106 in FIG. 5) and the I/O clock driver (e.g., 128 in FIG. 5).

Advantages of the present invention may include one or more of the following. In one or more embodiments of the present invention, because a self-correcting I/O interface driver scheme as described operates independent of a receiving circuit, the self-correcting I/O interface driver scheme may be used with any type of integrated or memory circuit. Thus, the performance of the receiving circuit is unaffected by the implementation of the self-correcting I/O interface driver scheme as described.

In one or more embodiments of the present invention, a self-correcting I/O interface driver scheme as described automatically reduces delay differences between an I/O data path and a I/O clock path, thereby improving I/O interface performance. Because I/O interface speeds are often a limiting factor in overall computer system performance, an improvement in I/O interface performance leads to increased overall computer system performance.

In one or more embodiments of the present invention, because a self-correcting I/O interface driver scheme as described is a closed loop system, minimal error is introduced into the self-correcting I/O interface driver scheme.

In one or more embodiments, because a self-correcting I/O interface driver scheme as described reduces delay difference between an I/O data path and a I/O clock path, a receiving circuit may more accurately latch incoming data.

In one or more embodiments, because a self-correcting I/O interface driver scheme as described may operate in a normal operation mode, random I/O interface components that would otherwise cause delay difference between the I/O data and clock paths may be compensated for.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:

a first adjustable driver residing along an I/O data path and arranged to drive data onto a data output pin of an integrated circuit;

a second adjustable driver residing along an I/O clock path and arranged to drive a clock signal onto a clock output pin of the integrated circuit; and a delay difference detector arranged to detect a difference in delays of signals operatively connected to inputs of the delay difference detector, wherein the data output pin and the clock output pin are operatively connected to the inputs of the delay difference detector, and wherein the delay difference detector has at least one output operatively connected to the first adjustable driver and the second adjustable driver.

2. The computer system of claim 1, wherein any one of the first adjustable driver and the second adjustable driver is one of a delay locked loop and a RC delay compensation circuit.

3. The computer system of claim 1, wherein the delay difference detector is arranged to effectively adjust at least one of a delay of the first adjustable driver and a delay of the second adjustable driver dependent on a delay difference between the data output pin and the clock output pin.

4. The computer system of claim 3, wherein a clock-like pattern is propagated through the I/O data path when the delay difference detector adjusts the at least one of the delay of the first adjustable driver and the delay of the second adjustable driver.

5. The computer system of claim 4, wherein a frequency of the clock-like pattern and the clock signal are substantially equal.

6. The computer system of claim 1, wherein the delay difference detector comprises at least one of a phase frequency detector and a phase detector.

7. The computer system of claim 1, wherein the delay difference detector is disposed on the integrated circuit.

8. The computer system of claim 1, further comprising a memory circuit having a data input pin and a clock input pin, wherein the data input pin is operatively connected to the data output pin of the integrated circuit, and wherein the clock input pin is operatively connected to the clock output pin.

9. The computer system of claim 8, wherein the memory circuit is SRAM.

10. The computer system of claim 1, wherein the integrated circuit is a microprocessor.

11. An I/O interface, comprising:

a microprocessor having an I/O data path operatively connected to a data output pin and an I/O clock path operatively connected to a clock output pin;

a delay difference detector arranged to detect a difference in delays of the data output pin and the clock output pin, wherein at least one of a delay of the I/O data path and a delay of the I/O clock path is adjusted dependent on the detected difference in delay; and a memory circuit arranged to receive data from the data output pin and a clock signal from the clock output pin.

12. The I/O interface of claim 11, wherein the delay difference detector is disposed on the microprocessor.

13. The I/O interface of claim 11, wherein the memory circuit is SRAM.

14. The I/O interface of claim 11, wherein the microprocessor further comprises:

a first driver arranged to drive data through the I/O data path; and a second driver arranged to drive a clock signal through the I/O clock path, wherein at least one output of the delay difference detector is operatively connected to the first driver and the second driver.

15. The I/O interface of claim 14, wherein the delay difference detector is arranged to adjust at least one of a delay of the first driver and a delay of the second driver.

16. The I/O interface of claim 11, wherein the delay difference detector comprises at least one selected from the group consisting a phase frequency detector and a phase detector.

17. A method for correcting an I/O interface, comprising:

propagating a signal through an I/O data path;

propagating a signal through an I/O clock path;

determining a delay difference between the I/O data path and the I/O clock path; and selectively adjusting at least one of the propagating the signal through the I/O data path and the propagating the signal through the I/O clock path dependent on the delay difference.

18. The method of claim 17, further comprising:

propagating a clock-like pattern through the I/O data path when determining the delay difference.

19. An integrated circuit, comprising:

first means for driving a signal through an I/O data path to a first output pin of the integrated circuit;

second means for driving a signal through an I/O clock path to a second output pin of the integrated circuit;

means for detecting a difference in delays of the first output pin and the second output pin; and means for selectively adjusting at least one of a delay of the first means and a delay of the second means dependent on the difference in delays.

20. The integrated circuit of claim 19, wherein the first means drives a clock-like signal through the I/O data path when the means for selectively adjusting adjusts at least one of the delay of the first means and the delay of the second means.

* * * * *